(12) United States Patent
Lin et al.

(10) Patent No.: US 12,108,637 B2
(45) Date of Patent: Oct. 1, 2024

(54) DISPLAY DEVICES WITH DETACHABLE BONDING AREAS AND MANUFACTURING METHODS THEREOF

(71) Applicant: YUNGU (GU'AN) TECHNOLOGY CO., LTD, Hebei (CN)

(72) Inventors: Tao Lin, Jiangsu (CN); Suhua Li, Jiangsu (CN); Dongya Chai, Jiangsu (CN); Bing Li, Jiangsu (CN)

(73) Assignee: YUNGU (GU'AN) TECHNOLOGY CO., LTD, Hebei (CN)

( * ) Notice: Subject to any disclaimer, the term of this patent is extended or adjusted under 35 U.S.C. 154(b) by 557 days.

(21) Appl. No.: 17/315,248

(22) Filed: May 7, 2021

(65) Prior Publication Data

US 2021/0265454 A1  Aug. 26, 2021

Related U.S. Application Data

(63) Continuation of application No. PCT/CN2019/114844, filed on Oct. 31, 2019.

(30) Foreign Application Priority Data

Apr. 12, 2019 (CN) .......................... 201910296084.0

(51) Int. Cl.
*H10K 59/131* (2023.01)
*H10K 50/844* (2023.01)
(Continued)

(52) U.S. Cl.
CPC ......... *H10K 59/131* (2023.02); *H10K 50/844* (2023.02); *H10K 77/111* (2023.02); *H10K 2102/311* (2023.02)

(58) Field of Classification Search
CPC ............... H10K 50/844; H10K 59/131; H10K 2102/311
See application file for complete search history.

(56) References Cited

U.S. PATENT DOCUMENTS

2013/0270528 A1* 10/2013 Lee .................. H10K 71/70
257/40
2014/0246687 A1* 9/2014 Ha ................... G06F 3/04164
257/668
(Continued)

FOREIGN PATENT DOCUMENTS

CN 206283717 U 6/2017
CN 107316881 A 11/2017
(Continued)

OTHER PUBLICATIONS

Chinese First Office Action 100191 (CN Application No. 201910296084.0) with English Translation, dated Mar. 19, 2020, 14 pages.
(Continued)

*Primary Examiner* — Lex H Malsawma
*Assistant Examiner* — Bruce R. Smith
(74) *Attorney, Agent, or Firm* — Quarles & Brady LLP

(57) ABSTRACT

Provided are a backplane and a display device. The backplane comprises an active area, a first binding area and a second binding area. The first binding area is detachably disposed on a side of the second binding area away from the active area, and both the first binding area and the second binding area are capable of being bonded to an external electronic assembly. By arranging two binding areas, if there is a defective product in a module process, the first binding area is detached, and the second binding area is attached to the external electronic assembly, such that the display device is repaired in the module process, thereby reducing a scrapping cost of the product.

17 Claims, 6 Drawing Sheets

(51) Int. Cl.
*H10K 77/10* (2023.01)
*H10K 102/00* (2023.01)

(56) References Cited

U.S. PATENT DOCUMENTS

2016/0225792 A1* 8/2016 Hwang .................. G09G 3/006
2018/0124933 A1 5/2018 Park et al.

FOREIGN PATENT DOCUMENTS

| CN | 107422551 A | | 12/2017 | |
|---|---|---|---|---|
| CN | 108039418 A | | 5/2018 | |
| CN | 108445660 A | | 8/2018 | |
| CN | 109407358 A | * | 3/2019 | ........... G02F 1/1309 |
| CN | 110047888 A | | 7/2019 | |

OTHER PUBLICATIONS

Chinese Second Office Action 100191 (CN Application No. 201910296084.0) with English Translation, dated Aug. 21, 2020, 13 pages.
International Search Report and Written Opinion (International Application No. PCT/CN2019/114844) with English Translation, dated Jan. 8, 2020, 11 pages.

* cited by examiner

DISPLAY DEVICES WITH DETACHABLE BONDING AREAS AND MANUFACTURING METHODS THEREOF

CROSS-REFERENCE TO RELATED APPLICATIONS

This application is a continuation application of International Application PCT/CN2019/114844, filed on Oct. 31, 2019, which claims priority to Chinese Patent Application No. 201910296084.0, filed on Apr. 12, 2019, and the disclosure of both applications are hereby incorporated by reference in their entirety.

TECHNICAL FIELD

The present application relates to a field of display technology.

BACKGROUND

Nowadays, with the development of multimedia technology and the advent of the information society, requirements for electronic devices are getting higher and higher. An Organic Light-Emitting Diode (OLED) display has a series of advantages such as autonomous light emission, low-voltage direct current (DC) drive, full curing, wide viewing angle, rich colors and the like. Compared with a liquid crystal display, the OLED display needs not to be provided with a backlight, has a wide viewing angle, a low power, a response speed that can reach 1,000 times that of the liquid crystal display, and a lower manufacturing cost than that of the liquid crystal display of the same resolution. Therefore, the OLED display has a broad application prospect and is regarded as one of the most competitive display technologies of flat panels in future.

SUMMARY

In order to address the above technical problems, embodiments of the present application provide a backplane and a display device, to reduce a scrapping cost if the backplane of the display device is a product with poor bonding.

In order to achieve the above objectives, the embodiments of the present disclosure provide the following technical solutions:

A backplane includes an active area, a first bonding area, and a second bonding area. The first bonding area is detachably disposed on a side of the second bonding area away from the active area. Both the first bonding area and the second bonding area are capable of being bonded to an external electronic assembly. If the backplane in a module process is defective, the first bonding area may be detached, such that the second bonding area cooperates with the external electronic component, to make the product of the display device in the module process to be repaired, thereby reducing the scrapping cost.

The embodiments of the present disclosure further provide a display device, which includes the backplane described above, an external electronic assembly, and an outer frame; the external electronic component includes a first external electronic component provided with a driving element. The outer frame is provided with a first groove and a second groove for receiving the driving element.

The embodiments of the present disclosure further provide a display device, which includes the backplane described above, an external element assembly, and an outer frame; the external element assembly includes a first external electronic component provided with a driving element, and the outer frame is provided with a third groove for receiving the driving element.

According to the backplane and the display device of the present application, when the first bonding area of the backplane is defective, the first bonding area can be detached, and the external electronic assembly is bonded to the second bonding area, such that the second bonding area can effectively bond a peripheral circuit and the backplane, thereby achieving an effective bonding, effectively solving the problem of too high scrapping cost when the defective product occurs in a case that only one bonding area is provided.

DETAILED DESCRIPTION OF THE EMBODIMENTS

Figure 1:
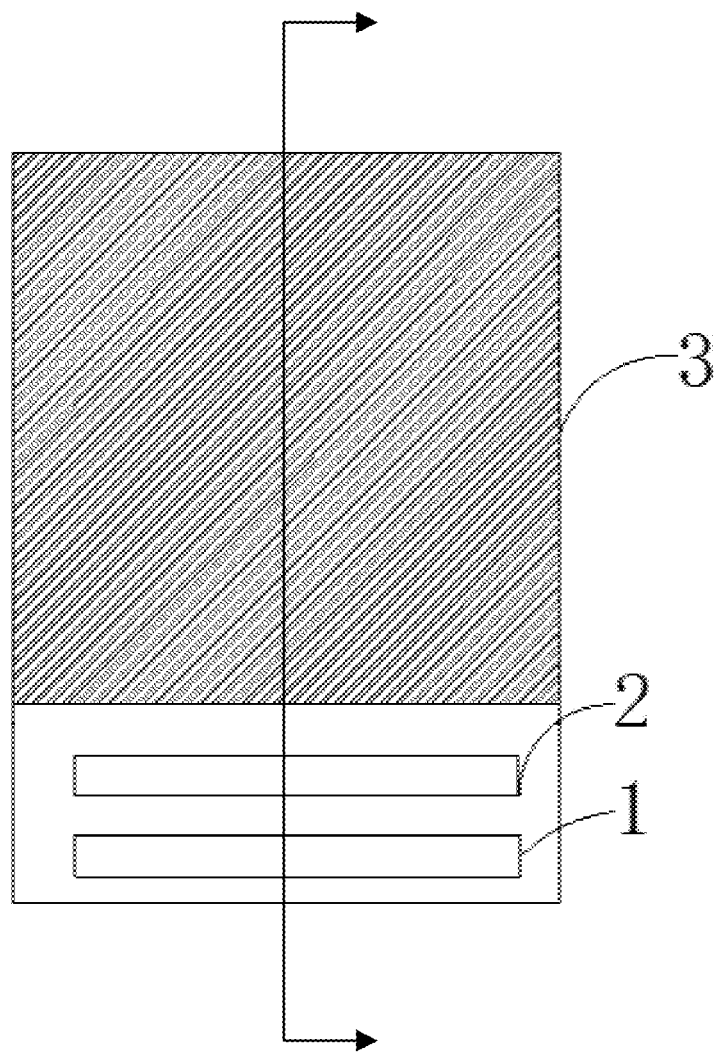
FIG. 1 is a schematic top view illustrating a backplane according to an embodiment of the present application.

A backplane of the OLED display usually includes an active area (AA) and an outer lead bonding area (OLB). The AA and the OLB are generally electrically connected by bonding metal terminals. Voltages and control signals required to drive the AA to work all come from an external driving chip. The driving chip is generally connected to the OLB through a Chip On Film (COF) or a Chip On PI (COP).

In actual manufacture, there is a problem that poor bonding causes an increased scrapping cost.

Exemplary embodiments will be described in detail herein, and examples thereof are shown in accompanying drawings. When the following description refers to the accompanying drawings, unless otherwise indicated, same reference numerals in different drawings indicate the same or similar elements. Implementations described in the following exemplary embodiments do not represent all implementations consistent with the present application. On the contrary, they are merely examples of devices consistent with some aspects of the present application described in the appended claims. Based on the embodiments of the present disclosure, all other embodiments obtained by those of ordinary skill in the art without creative work are intended to be within the protection scope of the present disclosure.

During a module bonding test, if there is a defective product in a flexible OLED module process, or if COF/COP bonding process-level raw materials are defective, removal of the COF/COP makes metal terminals on a backplane to be peeled off simultaneously, thus causing the products to be scrapped, and causing a high scrapping cost of the products. In view of such a problem existing in the OLED backplane, that is, when a defective product of the bonding process needs to be repaired, the metal terminals are damaged, which in turn causes the problem of the high scrapping cost of the product. A display panel and a manufacturing method thereof in the embodiments of the present application will be illustrated in detail below with reference to the drawings. If there is no conflict, the embodiments and features in the embodiments described below can be complementary to each other or be combined with each other.

Embodiments of the present application provide a backplane. The backplane of the present application can be applied in an AMOLED panel, a Micro-LED panel, a quantum dot panel, and the like. Only the AMOLED panel is taken as an example for description below. Referring to FIG. 1, the backplane includes an active area (AA) 3, a first bonding area 1 and a second bonding area 2. The first bonding area 1 is detachably disposed on a side of the second bonding area 2 away from the active area 3. Both the first bonding area 1 and the second bonding area 2 can be bonded to an external electronic component. The external electronic component refers to an electronic component independent of the backplane.

It should be noted that the active area 3 is a display component, which may specifically include structures such as a substrate, a light emitting device, an encapsulation layer and the like. The substrate may include a flexible substrate or a rigid substrate, and the flexible substrate may be made of a flexible material. The flexible material may be polyimide (PI) polymer, polycarbonate (PC) resin, also known as PC plastic, or polyethylene terephthalate (PET) plastic, etc. The rigid substrate can be made of organic glass. The light emitting device may be one of an AMOLED device, a Micro-LED device, a quantum dot device and the like. The first bonding area 1 and the second bonding area 2 are bonding components, each of which may include one or more layers. The active area 3, the first bonding area 1 and the second bonding area 2 are components of the backplane.

The active area 3, the first bonding area 1 and the second bonding area 2 may be arranged in parallel. The first bonding area 1 is disposed on the side of the second bonding area 2 away from the active area 3. The first bonding area 1 is detachably arranged, that is, the first bonding area 1 can be detached, or the first bonding area 1 may not be used and not detached. The operation for the first bonding area 1 can be selected as required.

The first bonding area 1 and the second bonding area 2 are two bonding areas with the same structure and same function, and can be used interchangeably. Both the first bonding area 1 and the second bonding area 2 can be bonded to the external electronic component. The first bonding area 1 and the second bonding area 2 are alternatively bonded to the external electronic component. The first bonding area 1 is preferentially bonded to the external electronic component, and the spare second bonding area 2 may be bonded to the external electronic component. When defective condition of the module process occurs and thus the first bonding area 1 is damaged, the second bonding area 2 is bonded to the external electronic component, so as to prevent damage to a bonding portion due to peeling off the first bonding area 1 when the defective condition of the module process occurs. The damage to the bonding portion may cause damage to the backplane and affect the function of the backplane, thus causing scrapping of the product. Since the spare second bonding area 2 is bonded to the external electronic component, the damaged first bonding area 1 can be detached, so that the backplane can be repaired, and the scrapping cost can be reduced. In this case, since the first bonding area 1 no longer affects the bonding function, the first bonding area 1 may remain in the backplane, which is not limited in the present application.

The external electronic component can be bonded to the first bonding area 1 or the second bonding area 2. The external electronic component herein may be a component independent of the backplane, and may specifically be a Chip On Film (COF), a flexible circuit board, a driving IC and the like.

Figure 2:
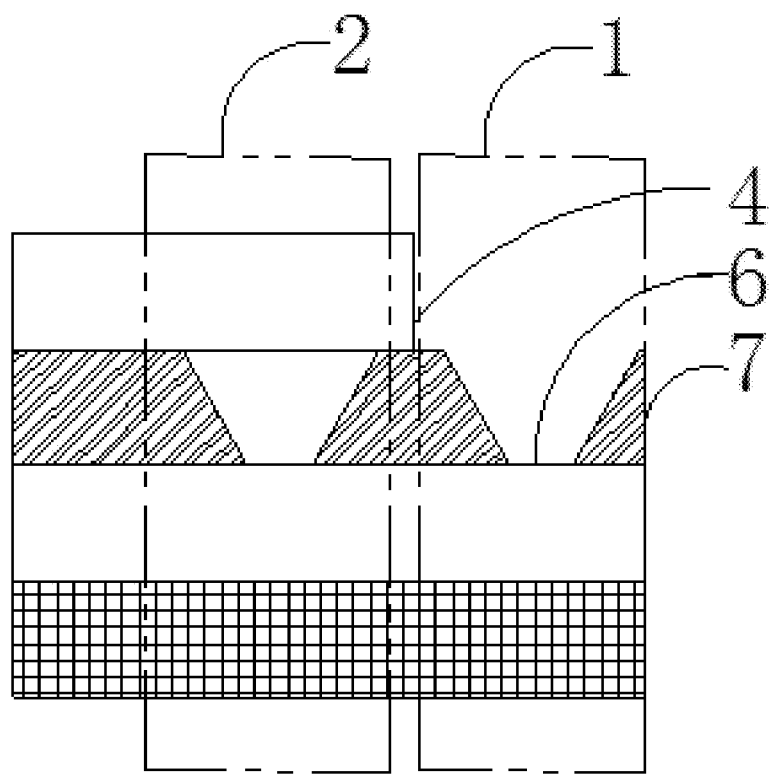
FIG. 2 is a cross-sectional view, taken along a line 2-2, of the backplane according to an embodiment of the present application.

In an embodiment, as shown in FIG. 2, the backplane includes the first bonding area 1 and the second bonding area 2. In order to protect the second bonding area 2 and prevent the second bonding area 2 from being scratched and corroding, a first protective layer 4 is disposed on the second bonding area 2. The first protective layer 4 is an independent structure, and may also be another component already provided in the backplane. The first protective layer 4 may be metal, organic material or inorganic material, which is not limited in this application.

In an embodiment, the backplane further includes an encapsulation layer. The encapsulation layer covers the active area 3. An encapsulation protective film is disposed on the encapsulation layer. The encapsulation layer is used to encapsulate the devices in the active area 3, for example, to encapsulate the AMOLED. In order to facilitate the subsequent bonding and other necessary operations after the encapsulation is completed, the encapsulation protective film is provided to protect the encapsulation layer. In order to further protect the second bonding area 2, the second bonding area 2 is provided with the same protective film, that is, the first protective layer 4 and an encapsulation protective film have a same material and are formed at the same time, such that the second bonding area 2 is protected by means of the same process, thereby simplifying the process.

In an embodiment, as shown in FIG. 2, both of the first bonding area 1 and the second bonding area 2 include a metal terminal 6 and a second protective layer 7 disposed around the metal terminal. Both the first bonding area 1 and the second bonding area 2 include a plurality of metal terminals 6. The metal terminals are bonded to the external electronic component. Each metal terminal corresponds to an electrical signal on the external electronic component. The second protective layer 7 is disposed around each metal terminal, so as to insulate and separate the metal terminals from each other and avoid signal crosstalk.

Figure 3:
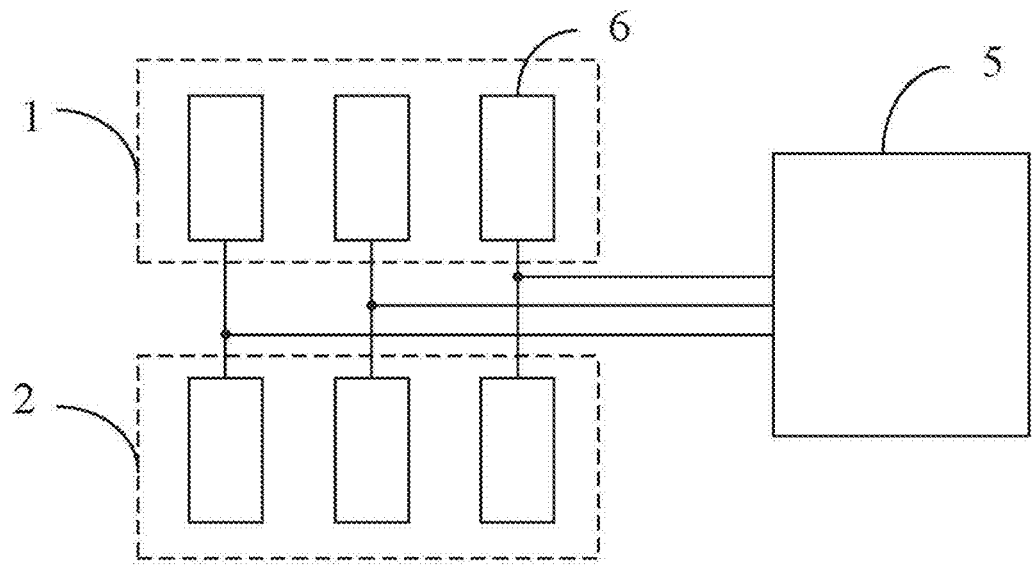
FIG. 3 is a schematic view illustrating metal terminals connected in parallel according to an embodiment of the present application.

In an embodiment, as shown in FIG. 3, both the first bonding area 1 and the second bonding area 2 include metal terminals, and there is a one-to-one correspondence between the metal terminals in the first bonding area 1 and the metal terminals of the second bonding area 2. Each metal terminal 6 in the first bonding area 1 and the corresponding metal terminal 6 in the second bonding area 2 are directly connected to the same terminal of a circuit element 5 in the backplane. In other words, one of the metal terminals 6 of the first bonding area 1 and a corresponding metal terminal 6 of the second bonding area 2 are directly connected to a same terminal of a circuit element 5 in the backplane. That is, the first bonding area 1 and the second bonding area 2 can be used interchangeably. In an embodiment, a plurality of metal terminals in the first bonding area 1 are separated and insulated from each other. A plurality of metal terminals in the second bonding area 2 are separated and insulated from each other. Specifically, there is a one-to-one correspondence between the metal terminals of the first bonding area 1 and the metal terminals of the second bonding area 2. In an embodiment, the circuit element 5 may be disposed on the backplane for transmitting a data signal, or disposed on the backplane for transmitting a scan signal, or a pixel circuit. After the metal terminals of the first bonding area 1 or the second bonding area 2 are bonded to the metal terminals on the external electronic component, an electrical signal of the external electronic component is transmitted to the circuit element 5 on the backplane via the bonded metal terminals 6. Specifically, for the AMOLED panel, the data signal on the external electronic component such as a driving chip is transmitted to the circuit element 5 such as pixel circuit disposed on the AMOLED panel via the bonded metal terminals 6, so as to control pixels to emit light. FIG. 3 of this embodiment illustratively shows connection relationships between three metal terminals of the first bonding area 1 and three metal terminals of the second bonding area 2 and the circuit element 5 on the backplane. In actual products, the number of metal terminals of the first bonding area 1 and the second bonding area 2 is configured according to actual requirements, which is not limited in the present application.

Figure 4:
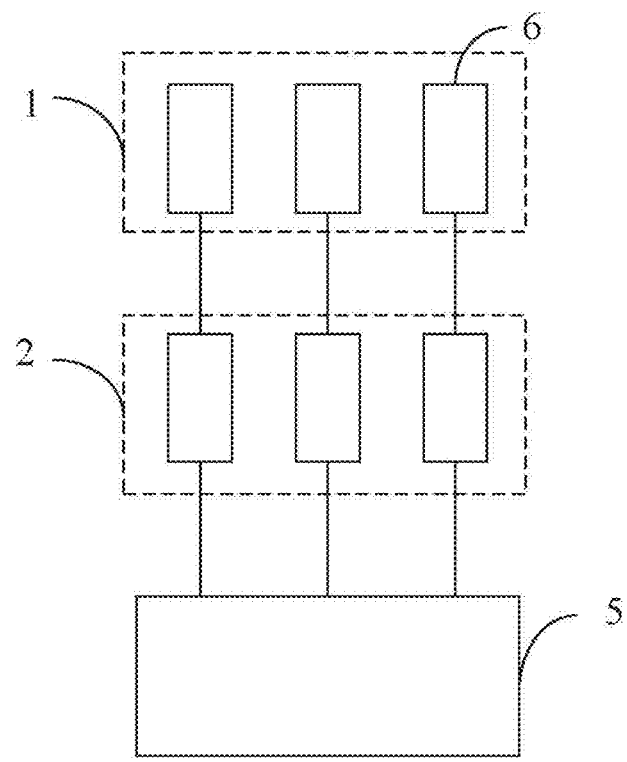
FIG. 4 is a schematic view illustrating metal terminals connected in series according to an embodiment of the present application.

In another embodiment, as shown in FIG. 4, there is a one-to-one correspondence between the metal terminals of the first bonding area 1 and the metal terminals of the second bonding area 2. Each metal terminal 6 of the first bonding area 1 and the corresponding metal terminal 6 of the second bonding area 2 are connected in series to the same terminal of the circuit element 5 in the backplane. When the first bonding area 1 is bonded to the external electronic component, the electrical signal of the external electronic component is transmitted to the circuit element 5 in the backplane via the metal terminal 6 of the first bonding area first and then via the metal terminal 6 of the second bonding area. When the second bonding area 2 is bonded to the external electronic component, the electrical signal of the external electronic component is directly transmitted to the circuit element 5 in the backplane via the metal terminal 6 of the second bonding area. Two sides of the first bonding area 1 and the second bonding area 2 can be provided with alignment marks such as "cross" marks, and two sides of the external electronic component can be provided with square marks. When the first bonding area 1 or the second bonding area 2 is bonded to the external electronic component, the relative positions of the alignment marks are controlled. When the "cross" marks are exactly in the centers of the square marks (that is, for example, when the "cross" marks on the first bonding area 1 overlap the square marks distributed in an array on the external electronic component), the metal terminals 6 of the first bonding area 1 or the second bonding area 2 are aligned with the metal terminals of the external electronic component, so as to adjust alignment deviation. FIG. 4 of this embodiment illustratively shows connection relationships between the three metal terminals 6 of the first bonding area 1 and the three metal terminals 6 of the second bonding area 2 and the terminals of the circuit element 5 on the backplane. In actual products, the number of the metal terminals of the first bonding area 1 and the second bonding area 2 is provided according to actual requirements, which is not limited in this application.

Figure 5:
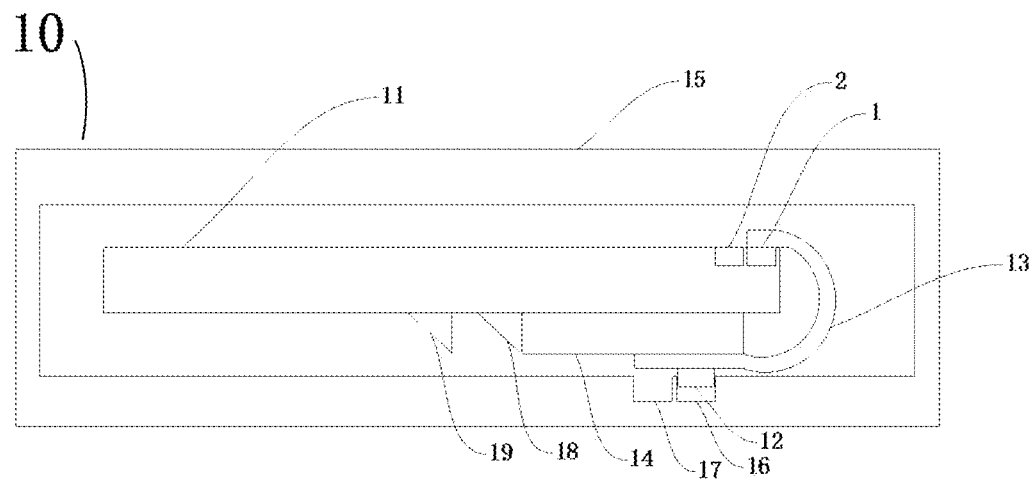
FIG. 5 is a structural schematic view illustrating a display device provided with a first bonding area and a second bonding area according to an embodiment of the present application.

Embodiments of the present application further provide a display device 10. As shown in FIG. 5, the display device includes the backplane 11 described in any one of the above embodiments, a first external electronic component 13 provided with a driving element 12, a second external electronic component 14, and an outer frame 15. The outer frame 15 defines a first groove 16 and a second groove 17 for accommodating the driving element 12. The backplane 11 is further provided with a first fixing portion 18 and a second fixing portion 19 for fixing the second external electronic component 14.

In an embodiment, as shown in FIG. 5, the second groove 17 is disposed on a side of the first groove 16 proximate to the first fixing portion 18. The second fixing portion 19 is disposed on a side of the first fixing portion 18 away from the second external electronic component 14. When the first bonding area 1 and the second bonding area 2 are disposed on the backplane 11, the driving element 12 is received in the first groove 16, and the second external electronic component 14 is attached to the first fixing portion 18. Specifically, the second external electronic component 14 is attached to the first fixing portion 18 by means of a snap connection. In this case, a length of the first external electronic component 13 is a first length, and a length of the second external electronic component 14 is a third length.

Figure 6:
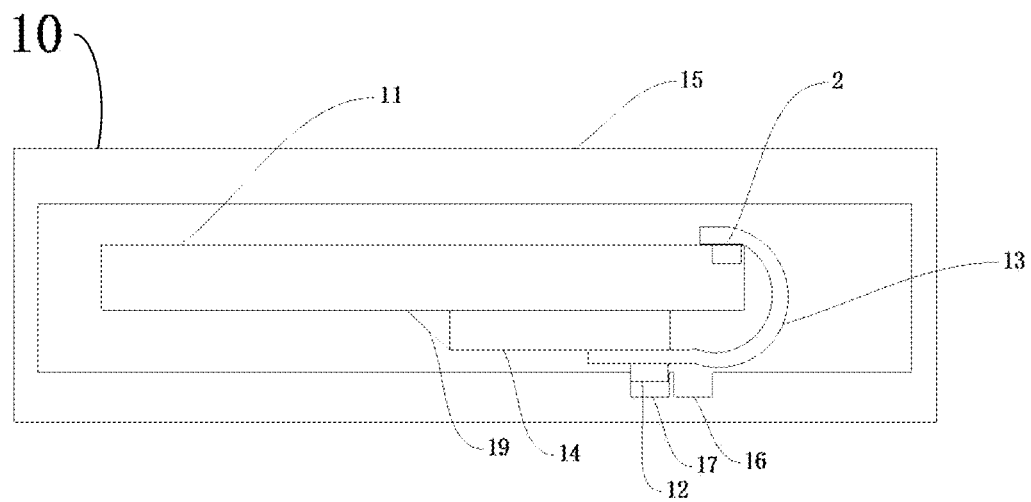
FIG. 6 is a structural schematic view illustrating the display device provided with only a second bonding area according to an embodiment of the present application.

In another embodiment of the present application, as shown in FIG. 6, when only the second bonding area 2 is disposed on the backplane 11, the driving element 12 is received in the second groove 17, and the second external electronic component 14 is attached to the second fixed portion 19. Specifically, the second external electronic component 14 is attached to the second fixing portion 19 by means of a snap connection. In this case, a length of the first external electronic component 13 is a second length, and a length of the second external electronic component 14 is a fourth length. A first distance between the first groove 16 and the second groove 17, a second distance between the first fixing portion 18 and the second fixing portion 19, and an interval between the first bonding area 1 and the second bonding area 2 are equal.

In the above embodiments, when the first bonding area 1 is damaged and removed, and when the second bonding area 2 is bonded, the driving element 12 of the first external electronic component 13 can still be received in the second groove 17, and the second external electronic component 14 can still be attached to the second fixing portion 19. That is, the first length is equal to the second length, and the third length is equal to the fourth length. The first bonding area 1 or the second bonding area 2 can be bonded without a need to change the lengths of the first external electronic component 13 and the second external electronic component 14.

In the above embodiments, the driving element 12 may be configured to electrically drive the circuit element 5 on the backplane, for example, the driving element 12 may be a driving IC chip. The first external electronic component 13 may be configured to be a COF or a COP. The driving element 12 is the driving IC chip disposed on the COF or the COP. The second external electronic component 14 may be a flexible circuit board, and the second external electronic component 14 is electrically connected to the first external electronic component 13. The first external electronic component 13 and the second external electronic component 14 may constitute an external electronic assembly, that is, a peripheral circuit. The first external electronic component 13 is bonded and connected to the backplane 11 via the first bonding area 1 or the second bonding area 2. That is, the peripheral circuit is electrically connected to the backplane 11. The second external electronic component 14 is connected and attached to the backplane 11 via the first fixing portion 18 or the second fixing portion 19.

In the above embodiments, the backplane 11 and the peripheral circuit are located within the outer frame 15. The outer frame 15 protects the backplane 11, the driving element 12, the first external electronic component 13 and the second external electronic component 14 located therein. The driving element 12 generally has a relative large thickness, and a receiving groove is necessarily provided on the outer frame 15. Since the backplane 11 of the present application is provided with two bonding areas, the first groove 16 and the second groove 17 are disposed on the outer frame 15 correspondingly to receive the driving elements 12 in two bonding modes respectively. The backplane 11 is also provided with the first fixing portion 18 and the second fixing portion 19 for fixing the second external electronic component 14 in the two bonding situations respectively. The second fixing portion 19 is disposed at an end of the second external electronic component 14 away from the first external electronic component 13, such that the first bonding area 1 or the second bonding area 2 can be bonded interchangeably without a need to change the lengths of the first external electronic component 13 and the second external electronic component 14, which makes the configuration of the display device more agile and compact.

In the above embodiments, when only the second bonding area 2 is disposed on the backplane 11, the first bonding area 1 may have been detached, and the driving element 12 is received in the second groove 17 on the outer frame, and the second external electronic component 14 is attached to the second fixing portion 19. In this case, the first external electronic component 13 has the second length, and the second external electronic component 14 has the fourth length. When the backplane 11 has the first bonding area 1 and the second bonding area 2 thereon, that is, if the first bonding area 1 is preferentially bonded, and the second bonding area 2 is not used for bonding, then the driving element 12 is received in the first groove 16, and the second external electronic component 14 is attached to the first fixing portion 18. In this case, the length of the first external electronic component 13 is the first length, and the length of the second external electronic component 14 is the third length. The second length is equal to the first length, and the fourth length is equal to the third length. Using the first external electronic component and the second external electronic component of the same specification in the two bonding situations can make the device more flexible and adaptable, and can reduce the use cost.

Figure 7:
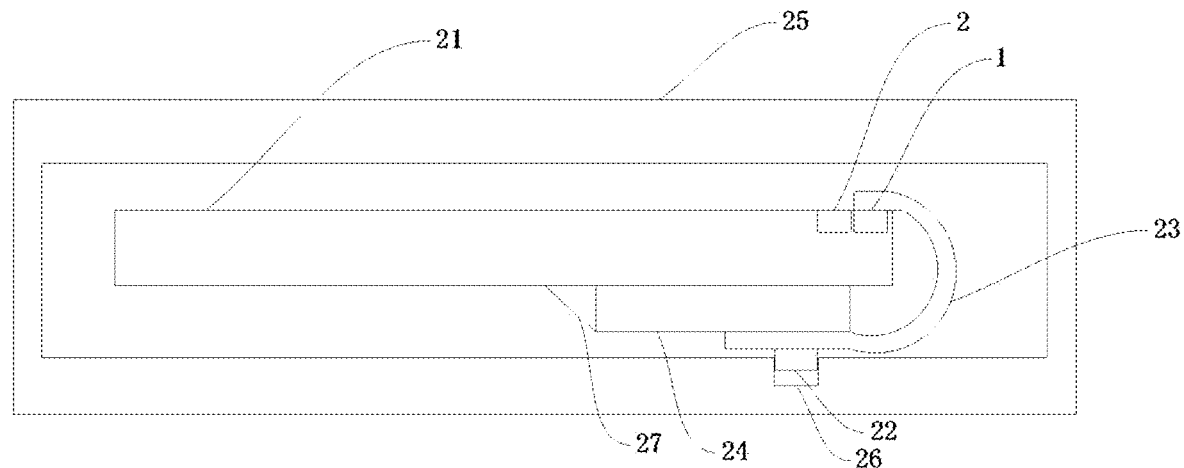
FIG. 7 is a structural schematic view illustrating the display device provided with a first bonding area and a second bonding area according to an embodiment of the present application.

Embodiments of the present application further provide a display device 20. As shown in FIG. 7, the display device 20 includes the backplane 21 described in any one of the above embodiments, a first external electronic component 23 provided with a driving element 22, a second external electronic component 24 and an outer frame 25. The outer frame 25 is provided with a third groove 26 for receiving the driving element 22. The backplane 21 is provided with a first fixing portion 27 for fixing the second external electronic component 24. The backplane 21 is provided with the first bonding area 1 and the second bonding area 2. The driving element 22 is received in the third groove 26. The second external electronic component 24 is attached to the first fixing portion 27. In this case, a length of the first external electronic component 23 is a fifth length, and a length of the second external electronic component 24 is a seventh length.

Figure 8:
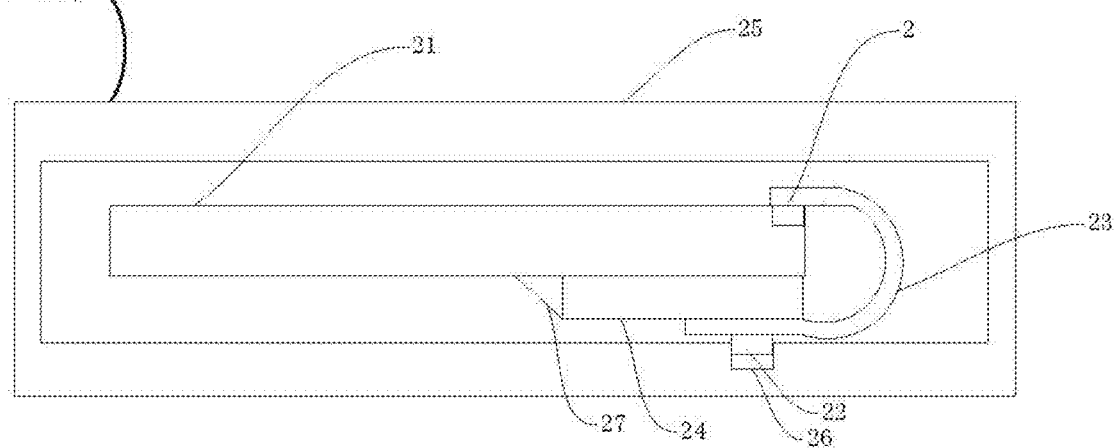
FIG. 8 is a structural schematic view illustrating the display device provided with only a second bonding area according to an embodiment of the present application.

In another embodiment of the present application, as shown in FIG. 8, the display device 20 includes a backplane 21, a first external electronic component 23 provided with a driving element 22, a second external electronic component 24 and an outer frame 25. The outer frame 25 is provided with a third groove 26 for receiving the driving element 22, and the backplane 21 is provided with a first fixing portion 27 for fixing the second external electronic component 24. When the first bonding area 1 is removed from the backplane 21, only a second bonding area 2 is disposed on the backplane 21; the driving element 22 is received in the third groove 26; and the second external electronic component 24 is attached to the first fixing portion 27. In this case, a length of the first external electronic component 23 is a sixth length, and a length of the second external electronic component 24 is an eighth length.

In the above two embodiments, the seventh length is equal to the eighth length. A difference between the sixth length and the fifth length is equal to a distance d between the first bonding area 1 and the second bonding area 2. That is, in the two bonding modes, the length difference of the first external electronic component 23 is equal to the distance d between the first bonding area 1 and the second bonding area 2. When only the second bonding area 2 is disposed on the backplane 21, the sixth length of the first external electronic component 23 is d longer than the fifth length of the first external electronic component 23 when the first bonding area 1 and the second bonding area 2 are disposed on the backplane 21. The length of the first external electronic component 23 is increased, thus in the two bonding modes, the driving element 22 is received in the same third groove 26, and the second external electronic component 24 in each bonding mode can use the first fixing portion 27, which is beneficial to simplification of the device.

The aforementioned display device may be a digital device such as a mobile phone, a tablet, a palmtop computer, an AR display, a VR display, an in-vehicle display, or the like, which is not limited in the present disclosure.

Figure 9:
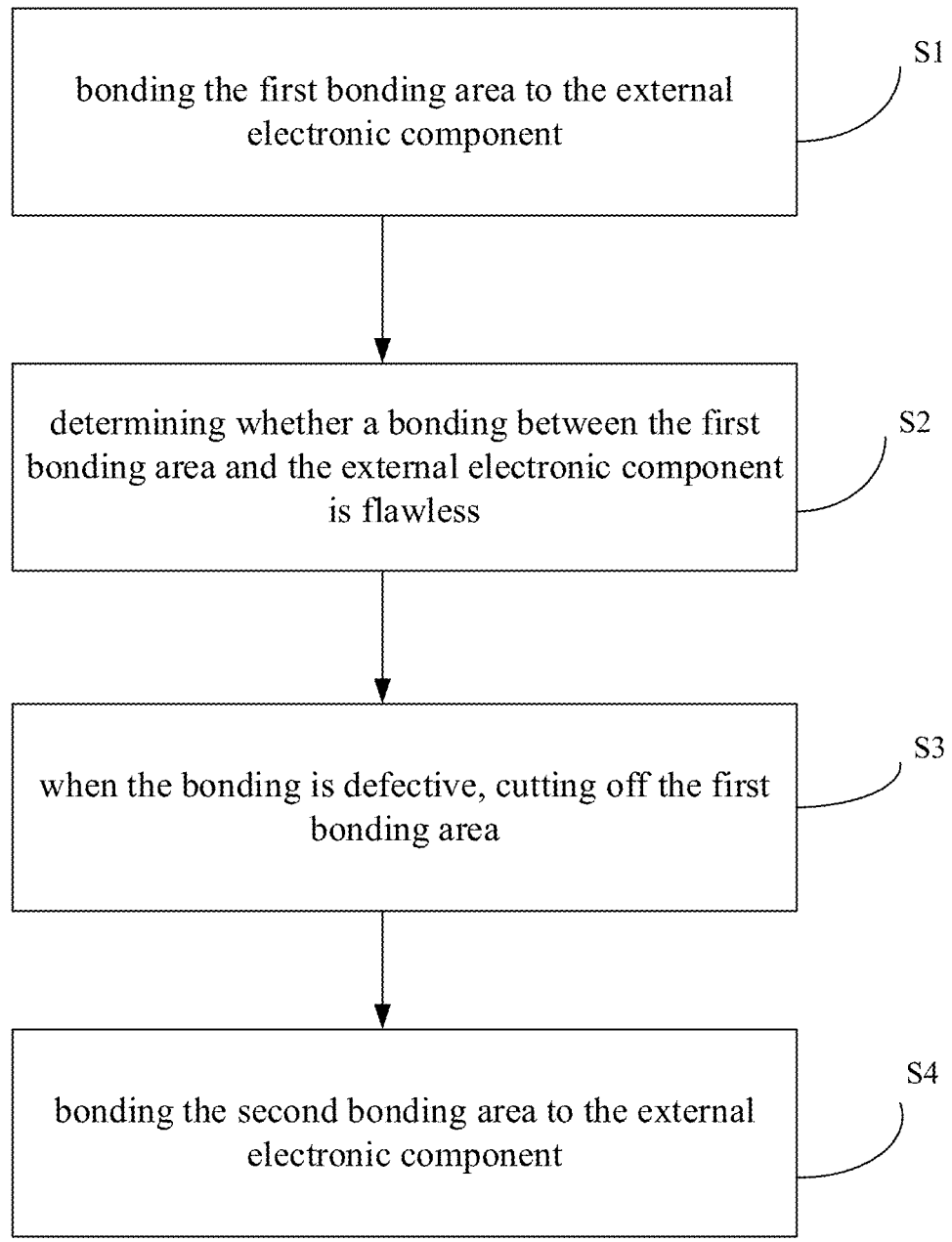
FIG. 9 is a flowchart of a manufacturing method of a display device according to an embodiment of the present application.

Embodiments of the present application further provide a manufacturing method of a display device. The display device is a display device described in any one of the above embodiments, and includes an active area, a first bonding area, a second bonding area, and an external electronic component. The first bonding area is detachably disposed on a side of the second bonding area away from the active area. Both the first bonding area and the second bonding area can be bonded to the external electronic component. The first bonding area is bonded to the external electronic component. The manufacturing method of the display device is shown in FIG. 9 and includes:

S1, bonding the first bonding area to the external electronic component;

S2, determining whether a bonding between the first bonding area and the external electronic component is flawless;

S3, when the bonding is defective, cutting off the first bonding area;

S4, bonding the second bonding area to the external electronic component.

In this embodiment, the first bonding area is firstly bonded to the external electronic component, and then a bonding test is performed to determine whether the bonding is flawless. If the bonding is defective, then the second bonding area needs to be used, and in this case, the first bonding area may be detached or not. The detaching method may be laser cutting, etching cutting, or may be selected as required, which is not limited in this application.

In this embodiment, after the defective first bonding area is removed, only the second bonding area is disposed in the backplane, and the second bonding area is bonded to the external electronic component, so that a signal of the external electronic component can be transmitted to the backplane.

Further, a first protective layer is disposed on the second bonding area.

Between step S3 and step S4, the following step is further included:

S30, cutting off the first protective layer to expose the second bonding area.

In this embodiment, in order to protect the metal terminals on the second bonding area which is temporarily not used from being oxidized and corroded, the first protective layer is disposed on the second bonding area. Since the first protective layer is disposed on the second bonding area, when the second bonding area needs to be used, the first protective layer needs to be cut off first to expose the second bonding area, and then the metal terminals of the exposed second bonding area are bonded to the external electronic component. The cutting method herein includes laser cutting, etching cutting, or the like, and may be selected as required, which is not limited in the present applications.

It should be noted that in the accompanying drawings, dimensions of layers and areas may be exaggerated for clarity of illustration. It can be understood that when an element or a layer is referred to as being "on" another element or layer, it can be directly on the other element or intermediate layers may be present. In addition, it can be understood that when an element or layer is referred to as being "under" another element or layer, it can be directly under the other element, or more than one intermediate layer or element may be present. In addition, it can also be understood that when a layer or element is referred to as being "between" two layers or two elements, it can be the only layer between the two layers or two elements, or more than one intermediate layers or elements may also be present. The same reference numeral throughout the description indicates the same element.

Those skilled in the art can easily think of other embodiments of the present disclosure after considering the specification and implementing the solutions disclosed herein. The present disclosure is intended to cover any variations, purposes, or adaptive changes of the present disclosure. These variations, purposes, or adaptive changes follow general principles of the present disclosure and include common knowledge or conventional technical means in the technical field which are not disclosed by the present disclosure. The specification and embodiments are merely illustrative, and the true scope and the spirit of the present disclosure are indicated by the following claims.

It should be understood that the present disclosure is not limited to the precise structure described above and shown in the accompanying drawings, and various modifications and changes can be made without departing from the scope of the present disclosure. The scope of the present disclosure is limited only by the appended claims.

What is claimed is:

1. A backplane, comprising: an active area;
a second bonding area; and
a first bonding area, detachably disposed on a side of the second bonding area away from the active area;
wherein both the first bonding area and the second bonding area are capable of being bonded to an external electronic assembly;
the first bonding area and the second bonding area each comprise a plurality of metal terminals and a plurality of second protective layers disposed around the metal terminals;
the plurality of metal terminals are insulated and separated from each other; and
the metal terminal of the first bonding area and a corresponding metal terminal of the second bonding area are connected in series to a same terminal of a circuit element on the backplane.

2. The backplane according to claim 1, further comprising an encapsulation layer covering the active area, wherein an encapsulation protective film is disposed on the encapsulation layer.

3. The backplane according to claim 2, wherein a first protective layer is disposed on the second bonding area, and the first protective layer and the encapsulation protective film have a same material and the first protective layer is integrated with the encapsulation protective film.

4. The backplane according to claim 1, wherein the metal terminals disposed in the first bonding area are separated and insulated from each other, and the metal terminals disposed in the second bonding area are separated and insulated from each other.

5. The backplane according to claim 4, wherein the plurality of metal terminals of the first bonding area and the plurality of metal terminals of the second bonding area have a one-to-one correspondence therebetween.

6. A display device, comprising:
a backplane, comprising: an active area, a second bonding area, and a first bonding area detachably disposed on a side of the second bonding area away from the active area; wherein both the first bonding area and the second bonding area are capable of being bonded to an external electronic assembly;
the external electronic assembly, comprising a first external electronic component provided with a driving element; and
an outer frame, provided with a first groove and a second groove for receiving the driving element.

7. The display device according to claim 6, wherein when the first external electronic component is bonded to the first bonding area,
the driving element is received in the first groove.

8. The display device according to claim 7, wherein the external electronic assembly further comprises a second external electronic component;
the second external electronic component is electrically connected to an end of the first external electronic component away from the backplane;
the backplane is further provided with a first fixing portion and a second fixing portion capable of fixing the second external electronic component; and
the second external electronic component is attached to the first fixing portion.

9. The display device according to claim 6, wherein when the first external electronic component is bonded to the second bonding area,
the driving element is received in the second groove.

10. The display device according to claim 9, wherein the external electronic assembly further comprises a second external electronic component;

the second external electronic component is electrically connected to an end of the first external electronic component away from the backplane;

the backplane is further provided with a first fixing portion and a second fixing portion configured to fix the second external electronic component; and the second external electronic component is attached to the second fixing portion.

11. The display device according to claim 8, wherein the second external electronic component is attached to the first fixing portion by means of a snap connection.

12. The display device according to claim 10, wherein the second external electronic component is attached to the second fixing portion by means of a snap connection.

13. The display device according to claim 6, wherein the first external electronic component is bonded to the first bonding area, and a length of the first external electronic component is a first length; or the first external electronic component is bonded to the second bonding area, and a length of the first external electronic component is a second length;

the first length is equal to the second length; and an interval between the first groove and the second groove is equal to an interval between the first bonding area and the second bonding area.

14. The display device according to claim 6, wherein the second external electronic component is attached to the first fixing portion, and a length of the second external electronic component is a third length; or the second external electronic component is attached to the second fixing portion, and a length of the second external electronic component is a fourth length;

the third length is equal to the fourth length; and an interval between the first fixing portion and the second fixing portion is equal to an interval between the first bonding area and the second bonding area.

15. A display device, comprising:

a backplane, comprising: an active area, a second bonding area, and a first bonding area detachably disposed on a side of the second bonding area away from the active area; wherein both the first bonding area and the second bonding area are capable of being bonded to an external electronic assembly;

the external electronic assembly, comprising a first external electronic component provided with a driving element; and an outer frame, provided with a third groove for receiving the driving element;

wherein when the first bonding area is removed from the backplane, and when the backplane is provided with only the second bonding area, the driving element is received in the third groove, and a length of the first external electronic component is a fifth length;

when the backplane is provided with the first bonding area and the second bonding area, the driving element is received in the third groove, and a length of the first external electronic component is a sixth length; and the fifth length is less than the sixth length, and a difference between the fifth length and the sixth length is equal to a distance between the first bonding area and the second bonding area.

16. The display device according to claim 15, wherein the external electronic assembly further comprises a second external electronic component;

the second external electronic component is electrically connected to an end of the first external electronic component, and the end of the first external electronic component is away from the backplane; the backplane is further provided with a first fixing portion configured to fix the second external electronic component; and the second external electronic component is attached to the first fixing portion.

17. The backplane according to claim 1, wherein the circuit element is disposed on the backplane for transmitting a data signal, or disposed on the backplane for transmitting a scan signal, or a pixel circuit.

* * * * *